US012671388B2

(12) United States Patent
Kawasaki et al.

(10) Patent No.: US 12,671,388 B2
(45) Date of Patent: Jun. 30, 2026

(54) BONDED BODY AND A METHOD OF PRODUCING THE SAME

(71) Applicant: NGK Insulators, Ltd., Nagoya (JP)

(72) Inventors: Takahiro Kawasaki, Tajimi-City (JP); Takuya Tomioka, Minamitsuru-District (JP)

(73) Assignee: NGK INSULATORS, LTD., Nagoya (JP)

( * ) Notice: Subject to any disclaimer, the term of this patent is extended or adjusted under 35 U.S.C. 154(b) by 895 days.

(21) Appl. No.: 18/048,951

(22) Filed: Oct. 24, 2022

(65) Prior Publication Data

US 2023/0074173 A1 Mar. 9, 2023

Related U.S. Application Data

(63) Continuation of application No. PCT/JP2021/041871, filed on Nov. 15, 2021.

(30) Foreign Application Priority Data

Mar. 25, 2021 (JP) ................................. 2021-051539

(51) Int. Cl.
| | |
|---|---|
| *H03H 9/00* | (2006.01) |
| *H03H 3/08* | (2006.01) |
| *H03H 9/02* | (2006.01) |
| *H03H 9/25* | (2006.01) |

(52) U.S. Cl.
CPC .......... *H03H 9/02574* (2013.01); *H03H 3/08* (2013.01); *H03H 9/02559* (2013.01); *H03H 9/25* (2013.01)

(58) Field of Classification Search
CPC .. H03H 9/02574; H03H 3/08; H03H 9/02559; H03H 9/25; H10N 30/073
See application file for complete search history.

(56) References Cited

U.S. PATENT DOCUMENTS

| | | | |
|---|---|---|---|
| 4,978,879 A | 12/1990 | Satoh et al. | |
| 7,213,314 B2 | 5/2007 | Abbott et al. | |
| 2007/0296304 A1* | 12/2007 | Fujii .................. | H03H 9/02929 310/313 A |
| 2008/0292127 A1* | 11/2008 | Ruile ................... | H03H 9/0222 381/337 |
| 2018/0175283 A1 | 6/2018 | Akiyama et al. | |

(Continued)

FOREIGN PATENT DOCUMENTS

| | | |
|---|---|---|
| JP | H02-037815 A | 2/1990 |
| JP | H04-258008 A | 9/1992 |

(Continued)

OTHER PUBLICATIONS

Japanese Office Action (Application No. 2022-520071) dated Feb. 13, 2024 (with English translation) (6 pages).

(Continued)

*Primary Examiner* — Julio C. Gonzalez
(74) *Attorney, Agent, or Firm* — Muncy, Geissler, Olds & Lowe, P.C.

(57) ABSTRACT

A bonded body has a supporting substrate composed of silicon, a piezoelectric material substrate, and a bonding layer provided on a surface of the supporting substrate and composed of silicon oxide. The bonding layer has a refractive index of 1.468 or higher and 1.474 or lower.

7 Claims, 4 Drawing Sheets

(56)     References Cited

U.S. PATENT DOCUMENTS

| | | |
|---|---|---|
| 2019/0007022 A1 | 1/2019 | Goto et al. |
| 2020/0304095 A1 | 9/2020 | Hori et al. |
| 2021/0111698 A1* | 4/2021 | Uno ................. H01L 21/76256 |
| 2021/0234530 A1 | 7/2021 | Uno et al. |

FOREIGN PATENT DOCUMENTS

| | | | |
|---|---|---|---|
| JP | 2008-028980 A | | 2/2008 |
| JP | 2009-516966 A | | 4/2009 |
| JP | 2010040877 A | * | 2/2010 |
| JP | 2016-225537 A | | 12/2016 |
| KR | 10-2021-0006995 A | | 1/2021 |
| WO | WO-2019244461 A1 | * | 12/2019 ....... H01L 21/76256 |
| WO | 2020/079959 A1 | | 4/2020 |
| WO | 2020/095924 A1 | | 5/2020 |

OTHER PUBLICATIONS

Korean Office Action (with English translation) dated May 31, 2024 (Application No. 10-2022-7036404).

Matthias Knapp, et al., "Accurate Characterization of $SiO_2$ Thin Films Using Surface Acoustic Waves," *IEEE Transactions of Ultra-sonics, Ferroelectrics, and Frequency Control*, vol. 62, No. 4, Apr. 2015, pp. 736-743. (8 pages).

Atsushi Nishimura, et al., "The Temperature Coefficients of Frequency of Surface Acoustic Wave Devices with $SiO_xN_y$ Passivation Films on $LiTaO_3$ Substrates," *IEEE Transactions of Ultrasonics, Ferroelectrics, and Frequency Control*, vol. 68, No. 5, May 2021, pp. 1965-1971. (7 pages).

Japanese Office Action (Application No. 2022-520071) dated Oct. 24, 2023 (with English translation) (6 pages).

Extended European Search Report (Application No. 21933225.1) dated Oct. 19, 2023 (11 pages).

C. Roda Neve, et al., "Impact of Si Substrate Resistivity on the Non-Linear Behaviour of RF CPW Transmission Lines" (Jan. 2008), *Proceedings of the 3rd European Microwave Integrated Circuits Conference*, Oct. 2008, pp. 36-39 (4 pages).

Frederick M. Fowkes, et al., "Control of Fixed Charge at $Si—SiO_2$ Interface by Oxidation-Reduction Treatments," *Applied Physics Letters*, vol. 22, 1973, pp. 377-379 (4 pages).

International Search Report and Written Opinion (Application No. PCT/JP2021/041871) dated Feb. 15, 2022 (with English translation).

English translation of the International Preliminary Report on Patentability (Chapter I) dated Dec. 27, 2022 (Application No. PCT/JP2021/041871).

* cited by examiner

Ratio of flow rates of Ar/O2 gases

Target Discharge Voltage (V)

BONDED BODY AND A METHOD OF PRODUCING THE SAME

REFERENCE TO RELATED APPLICATIONS

This application is a continuation application of PCT/JP2021/041871, filed Nov. 15, 2021, which claims priority to Japanese Application No. JP2021-051539 filed on Mar. 25, 2021, the entire contents all of which are incorporated hereby by reference.

TECHNICAL FIELD

The present invention is related to a bonded body of a piezoelectric material substrate and supporting substrate composed of silicon.

BACKGROUND OF THE INVENTION

An acoustic surface wave device, which can be functioned for a filter device or vibrator contained in a mobile phone or the like, or an acoustic wave device such as a Lamb wave device or film bulk acoustic resonator (FBAR) including a piezoelectric thin film have been known. It is known an acoustic wave device provided by adhering a supporting substrate and a piezoelectric material substrate propagating surface acoustic wave and by providing a comb electrode capable of oscillating the surface acoustic wave on a surface of the piezoelectric material substrate.

When a piezoelectric material substrate and silicon substrate are bonded, it is known to form a silicon oxide film on the surface of the piezoelectric material substrate and to directly bond the piezoelectric material substrate and silicon substrate through the silicon oxide film (Patent documents 1 and 2). When the bonding is performed, plasma beam is irradiated on the surface of the silicon oxide film and surface of the silicon substrate to activate the surfaces so that the direct bonding is performed (plasma activation method). According to the plasma activation method, the bonding can be performed at a relatively low temperature (400° C.).

Further, in an SAW filter having a wafer of SOI (Silicon-on-Insulator structure having an Si wafer and SiO2 film formed thereon), it is known that high frequency distortion appears by the effect of fixed charge generated at an interface of the $SiO_2$ film and Si wafer (Non patent document 1).

Further, it is reported that the amount of the fixed charge is changed depending on the difference of film quality of the $SiO_2$ film and that the fixed charge is increased as the oxygen ratio of the $SiO_2$ film is lowered (Non-patent document 2).

(Non-patent document 1) "Impact of Si substrate resistivity on the non-linear behaviour of RF CPW transmission lines" (January 2008), Proceedings of the 3rd European Microwave Integrated Circuits Conference (Non-patent document 2) "Control of fixed charge at Si—SiO2 interface by oxidation-reduction treatments" (January 2073)), Appl. Phys. Lett., Vol. 22, No. 8, 15 Apr. 1973

(Patent document 1) Japanese patent publication No. 2016-225537 A (Patent document 2) U.S. Pat. No. 7,213,314 B2

SUMMARY OF THE INVENTION

As described above, although it is speculated that the control of film quality of $SiO_2$ film is effective for suppressing the high frequency distortion, it has not been made clear the method of suppressing and controlling the high frequency distortion through the control of the film quality.

An object of the present invention is to reduce high frequency distortion in a bonded body having a piezoelectric material substrate bonded with a supporting substrate composed of silicon through a bonding layer composed of silicon oxide.

The present invention provides a bonded body comprising:

a supporting substrate comprising silicon;

a piezoelectric material substrate; and a bonding layer provided on a surface of the supporting substrate, the bonding layer comprising silicon oxide;

wherein the bonding layer has a refractive index of 1.468 or higher and 1.474 or lower.

The present invention further provides a method of producing a bonded body, the method comprising the steps of:

growing a bonding layer comprising silicon oxide on a surface of a supporting substrate comprising silicon by reactive ion sputtering method which is performed with at least an inert gas and oxygen gas flown in a ratio of a flow rate of said inert gas with respect to a flow rate of said oxygen gas (said flow rate of said inert gas/said flow rate of said oxygen gas) adjusted at 1.5 to 2.0; and bonding the bonding layer to a piezoelectric material substrate.

In the case that silicon oxide is formed in a reactive sputtering system, the inventors researched the relationship of the film quality and high frequency distortion. Specifically, as the method of evaluating the film quality, the refractive index of the film was measured by means of an ellipsometer to calculate a value at a wavelength of 633 nm, which was used as an indicator. Further, the ratio of the flow rates of the inert gas such as argon gas and oxygen gas introduced into the sputtering system was changed during the formation of the silicon oxide film, so that the refractive index of the silicon oxide film was changed.

As a result, it was found that the high frequency distortion is reduced in the case that the refractive index of the boning layer is 1.468 or higher and 1.474 or lower. Further, the ratio of the flow rates of the inert gas and oxygen gas is controlled in a range of 1.5 to 2.0 so that the high frequency distortion component can be suppressed.

Although the mechanism of such effects is not clear, it is considered that the oxygen amount in the silicon oxide film forming the bonding layer is changed to reduce the amount of the fixed charge.

As a result, according to the present invention, it is possible to suppress the high frequency distortion, in a bonded body having a piezoelectric material substrate bonded to a supporting substrate composed of silicon through a bonding layer composed of a silicon oxide film.

Figure 2A:
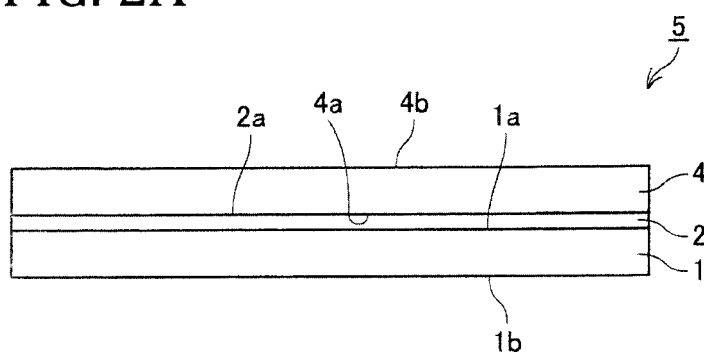
FIG. 2A shows the state that a piezoelectric material substrate 4 and the supporting substrate 1 are bonded.
Figure 2B:
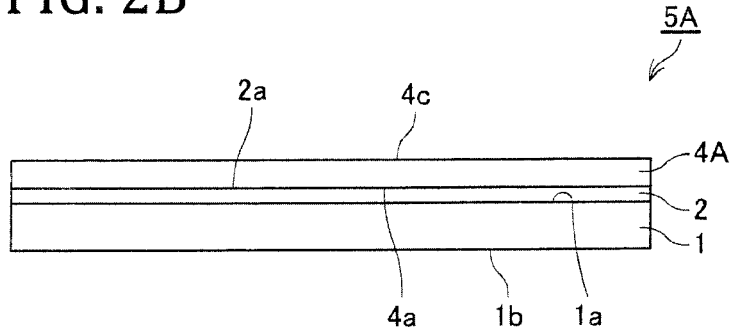
FIG. 2B shows the state that a piezoelectric material substrate 4A
Figure 2C:
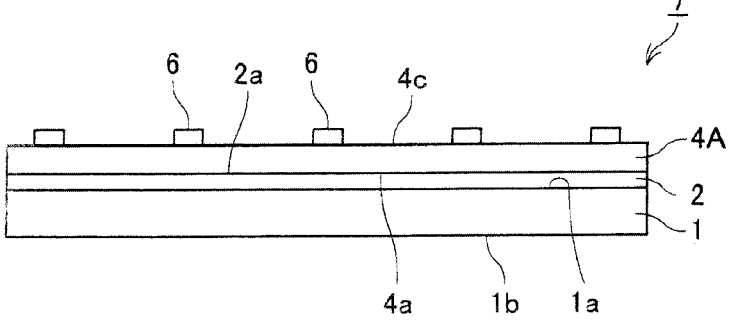

3 is thinned by processing, and FIG. 2C shows the state that an electrode 6 is provided on the piezoelectric material substrate 4A.

Figure 3:
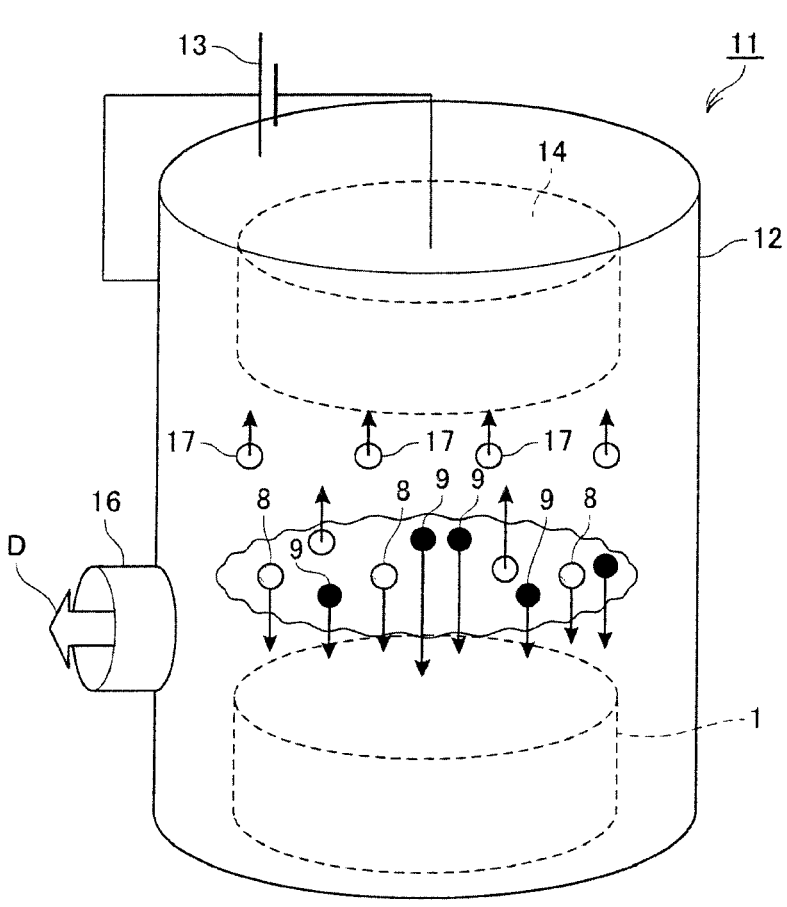

FIG. 3 is a diagram illustrating the concept of a reactive sputtering system.

Figure 4:
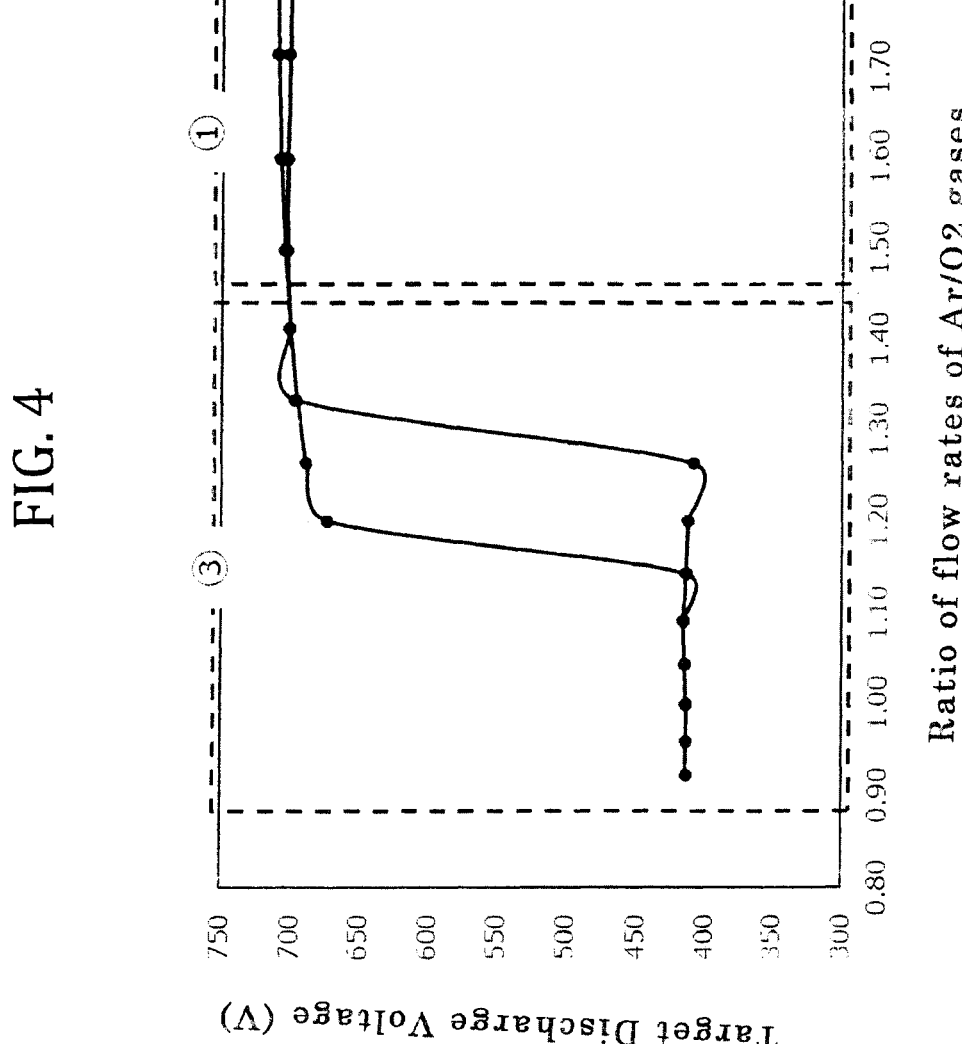

FIG. 4 is a graph showing relationship of the ratio of flow rates of argon gas/oxygen gas and a target discharge voltage.

DETAILED DESCRIPTION

The present invention will be described in detail below, appropriately referring to drawings.

FIGS. 1A-1C and 2A-C are diagrams for illustrating a production example of directly bonding a supporting substrate onto a piezoelectric material substrate.

Figure 1A:
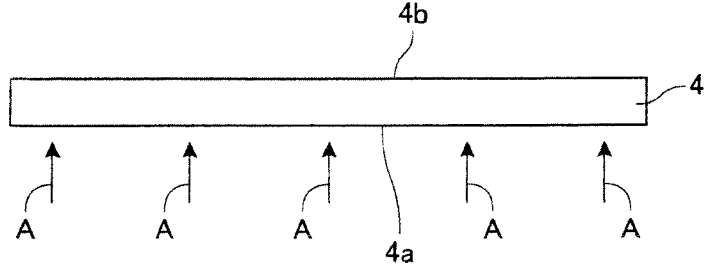
FIG. 1A shows the state that a bonding surface 4a of a piezoelectric material substrate 4 is activated by plasma beam A.
Figure 1B:
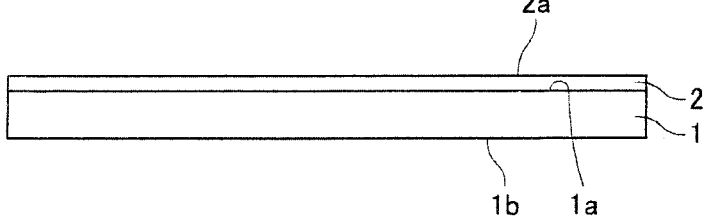
FIG. 1B shows the state that a bonding layer 2 is formed on a surface 1a of a supporting substrate 1.
Figure 1C:
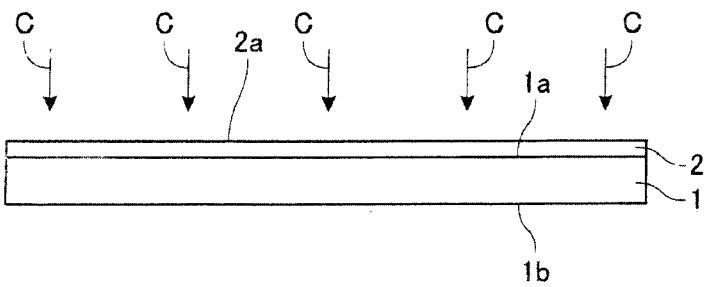
FIG. 1C shows the state that a bonding surface 2a of the bonding layer 2 on the supporting substrate 1 is activated by plasma beam C.

As shown in FIG. 1A, a piezoelectric material substrate 4 has main surfaces 4a and 4b. Plasma beam is irradiated onto the main surface 4a of the piezoelectric material substrate 4 as arrows A to activate the main surface 4a, providing an activated surface. Further, as shown in FIG. 1B, a bonding layer 2 composed of a silicon film is provided on a bonding surface 1a of a supporting substrate. 1b represents a main surface on the opposite side of the bonding surface 1a. Then, as shown in FIG. 1C, plasma beam C is irradiated onto the bonding surface 2a of the bonding layer 2 to perform the activation, providing an activated surface.

Then, as shown in FIG. 2A, the activated bonding surface 2a of the bonding surface 2 and the activated main surface 4a of the piezoelectric material substrate 4 are directedly bonded to obtain a bonded body 5.

Then, the bonding surface 4b of the piezoelectric material substrate 4 of the bonded body 5 is further subjected to polishing treatment to make the thickness of the piezoelectric material substrate 4A smaller, obtaining a bonded body 5A, as shown in FIG. 2B. 4c represents a polished surface.

According to FIG. 2C, predetermined electrodes 6 are formed on the polished surface 4c of the piezoelectric material substrate 4A to produce an acoustic wave device 7.

According to the present invention, the supporting substrate is composed of silicon. The relative density of the supporting substrate may preferably be 95.5% or higher and may be 100%, on the viewpoint of the bonding strength. The relative density is measured by Archimedes method. Further, although the production method of the supporting substrate is not particularly limited, sintering method may preferably be applied.

Silicon constituting the supporting substrate may preferably be a high resistance silicon. The high resistance silicon means silicon whose volume resistivity is 1000 Ωcm or higher. The upper limit of the volume resistivity of the high resistance silicon is usually 10 kΩcm, on the viewpoint of production.

Although the material of the piezoelectric material substrate is not particularly limited as far as it has necessary piezoelectricity, a single crystal having a composition of $LiAO3$ is preferred. Here, A is one or more element(s) selected from the group consisting of niobium and tantalum. Thus, $LiAO_3$ may be lithium niobate, lithium tantalate, or a lithium niobate-lithium tantalate solid solution.

Although the thickness of the bonding layer is not particularly limited, the thickness may preferably be 0.01 to 10 μm and more preferably be 0.01 to 0.5 μm, on the viewpoint of production cost.

The refractive index of the bonding layer is made 1.468 or higher and 1.474 or lower. It is thereby possible to reduce the high frequency distortion.

The refractive index of the bonding layer is measured by means of an ellipsometer under the following conditions.

That is, silicon oxide is film-formed in 400 nm to 500 nm on the Si substrate and the refractive index is measured by means of a spectroscopic ellipsometer. The incident angle and reflecting angle are set at 70°, incident light of a wavelength of 200 nm to 1000 nm is irradiated onto the substrate and the reflective index is calculated based on the polarized state of the reflected light.

The method of film-forming the bonding layer may preferably be reactive sputtering method.

That is, the present inventors researched the relationship between the film quality and high frequency distortion, in the case that the silicon oxide film is formed by the reactive sputtering system. In this case, as the method of evaluating the film quality of the silicon oxide film, the refractive index of the film was measured by the ellipsometer to calculate the value at a wavelength of 633 nm, which is applied as an indicator.

Further, during the formation of the silicon oxide film, the ratio of the flow rates of the inert gas and oxygen gas supplied into the sputtering system is changed so that the refractive index can be intentionally changed.

The procedure of forming the silicon oxide film by means of the reactive sputtering system will be described further, referring to FIG. 3.

A target 14 and supporting substrate 1 are opposed to each other in an inner space of a housing 11 of a system. A positive electrode of an electric source 13 is connected to a housing 12, and a negative electrode is connected to the target 14. A silicon target is applied as the target 14. Then, an inert gas and oxygen gas are supplied into the inner space of the housing 12 to generate plasma. As a result, atoms 17 of the inert gas flow toward the target 14. Further, oxygen atoms 8 and silicon atoms 9 flow toward the surface of the supporting substrate 1. Excessive gas is discharged from a discharge hole 16 as an arrow D. During the process, silicon oxide is generated on the supporting substrate as the reaction product of oxygen and silicon.

Here, as the present inventors have tried to form a film of the bonding layer composed of the silicon oxide film in ratios of the flow rates (inert gas/oxygen gas) in a range of 0.9 to 3.5, the high frequency distortion component can be suppressed in a range of 1.5 to 2.0. Further, the refractive index of the bonding layer can be thereby adjusted in 1.468 to 1.474 (at a wavelength of 633 nm). It is considered that the refractive index of the bonding layer reflects the oxygen ratio contained in the silicon oxide film.

Further, in the case that the ratio of the flow rates (inert gas/oxygen gas) is in a range of 0.9 or higher and less than 1.5, it is found that the film-formation mode in the reactive sputtering is changed from metal mode to oxide mode. It can be judged by monitoring the change of the value of target discharge voltage.

That is, FIG. 4 is a graph showing the results of plots of the change of the ratio of flow rates of the inert gas (argon)/oxygen and change of the discharge voltage, in the case that the discharge is controlled at a constant electric power. The discharge voltage is stabilized in the case that the ratio of the flow rates is 1.5 or higher. However, in the case that the ratio of the flow rates is less than 1.5, the discharge voltage is rapidly lowered and hysteresis was observed. This is because the inner space of the housing is of the oxygen-rich state and the surface of the target is oxidized so that the film-formation mode is switched to the oxide mode. As the film-formation mode is switched to the oxide mode, the film formation rate is lowered and the surface of the target is oxidized so that an insulating layer is formed and abnormal discharge (arcing) is generated, providing a film inappropriate as the bonding layer.

Further, the film forming rate of the silicon oxide film forming the bonding layer may preferably be in a range of 0.17 to 0.4 [nm/sec], and the bonding layer having the refractive index described above can be easily obtained in the range.

Although the specific production condition of the bonding layer is appropriately selected depending on the specification of the chamber, according to a preferred example, the total pressure is made 0.28 to 0.34 Pa, an oxygen partial pressure is made $1.2\times10$-3 to $5.7\times10$-2 Pa. The film-forming temperature is preferably made ambient temperature to 250° C.

Further, B is exemplified as a dopant of the Si target.

The inert gas supplied into the reactive sputtering system may be argon.

Further, the current and voltage during the reactive sputtering may preferably be 5 to 10 A and 500 to 900V, respectively.

According to a preferred embodiment, the activated bonding surface of the bonding layer and activated bonding surface of the piezoelectric material substrate are directly bonded with each other. In other words, a direct bonding interface is present along an interface between the bonding layer and piezoelectric material substrate. In this case, the arithmetic average roughness Ra of the activated bonding surface of the bonding layer may preferably be 1 nm or lower and may more preferably be 0.3 nm or lower. Further, the arithmetic average roughness Ra of the activated bonding surface of the piezoelectric material substrate may preferably be 1 nm or lower and more preferably be 0.3 nm or lower. The bonding strength of the piezoelectric material substrate and bonding layer is further improved.

The respective constituents of the present invention will be further described below.

The applications of the bonded body of the present invention are not particularly limited and, for example, it may be suitably applied for an acoustic wave device or optical device.

As the acoustic wave device, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating surface acoustic wave and IDT electrodes on the output side for receiving the surface acoustic wave on the surface of the piezoelectric material substrate. By applying high frequency signal on the IDT electrodes on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A metal film may be provided on a bottom surface of the piezoelectric material substrate. After the Lamb type device is produced as the acoustic wave device, the metal film plays a role of improving the electro-mechanical coupling factor near the bottom surface of the piezoelectric material substrate. In this case, the Lamb type device has the structure that interdigitated electrodes are formed on the surface of the piezoelectric material substrate and that the metal film on the piezoelectric material substrate is exposed through a cavity provided in the supporting body. Materials of such metal films include aluminum, an aluminum alloy, copper, gold or the like, for example. Further, in the case that the Lamb wave type device is produced, it may be used a composite substrate having the piezoelectric material layer without the metal film on the bottom surface.

Further, a metal film and an insulating film may be provided on the bottom surface of the piezoelectric material substrate. The metal film plays a role of electrodes in the case that the thin film resonator is produced as the acoustic wave device. In this case, the thin film resonator has the structure that electrodes are formed on the upper and bottom surfaces of the piezoelectric material substrate and the insulating film is made a cavity to expose the metal film on the piezoelectric material substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like, for example.

Further, as the optical device, an optical switching device, wavelength converting device and optical modulating device may be exemplified. Further, a piezoelectric inversion structure may be formed in the piezoelectric material substrate.

In the case that an object of the present invention is the acoustic wave device and the material of the piezoelectric material substrate is lithium tantalate, it is preferred to use the substrate rotated from Y-axis to Z-axis by 36 to 47° (for example) 42° around X-axis, which is a direction of propagation of a surface acoustic wave, because of a low propagation loss. Further, in the case that the piezoelectric material substrate is made of lithium niobate, it is preferred to use the substrate rotated from Y-axis to Z-axis by 60 to 68° (for example 64°) around X-axis, which is a direction of propagation of a surface acoustic wave, because of a low propagation loss. Further, although the size of the piezoelectric material substrate is not particularly limited, for example, the diameter may be 50 to 150 mm and thickness may be 0.2 to 60 μm.

The following method is preferred for obtaining the bonded body of the present invention.

First, plasma is irradiated onto the bonding surface of the bonding layer and bonding surface of the piezoelectric material substrate to activate the respective bonding surfaces.

The atmosphere during the surface activation is made atmosphere containing nitrogen or oxygen. The atmosphere may be oxygen only, nitrogen only or mixed gases of oxygen and nitrogen, hydrogen and argon. In the case of the mixed gases, the ratio may be appropriately adjusted depending on the bonding strength, although it is not particularly limited.

The pressure of the atmosphere during the surface activation may preferably be 100 Pa or lower and more preferably be 80 Pa or lower. Further, the pressure of the atmosphere may preferably be 30 Pa or higher and more preferably be 50 Pa or higher.

The temperature during the plasma irradiation is made 150° C. or lower. It is thereby possible to obtain a bonded body 7 having a high bonding strength and without deterioration of a piezoelectric material. On the viewpoint, the temperature during the plasma irradiation is made 150° C. or lower and may be preferably made 100° C. or lower.

Further, the energy during the plasma irradiation may preferably be 30 to 150 W. Further, the product of the energy and irradiation time period during the plasma irradiation may preferably be 0.1 to 1.0 Wh.

According to a preferred embodiment, the bonding surface 4a of the piezoelectric material substrate and bonding surface 2a of the bonding layer are subjected to flattening, before the plasma treatment. The method of flattening the respective bonding surfaces 2a and 4a may be lapping or chemical mechanical polishing (CMP). Further, the arithmetic average roughness Ra of the flattened surface may preferably be 1 nm or lower and more preferably be 0.3 nm or lower.

Then, the activated bonding surface of the piezoelectric material substrate and activated bonding surface of the bonding layer are contacted and bonded. Thereafter, preferably, the bonded body is subjected to thermal treatment so that it is possible to obtain a strength capable of enduring the polishing treatment of the piezoelectric material substrate. The temperature of the thermal treatment may preferably be 100 to 150° C. According to the present embodiment, the piezoelectric material substrate may be processed to make the thickness smaller after the thermal treatment.

Then, the activated surfaces are contacted and bonded with each other under vacuum atmosphere. The temperature at this time is ambient temperature, specifically 40° C. or lower and more preferably 30° C. or lower. Further, the temperature during the bonding may particularly preferably 20° C. or higher and 25° C. or lower. The pressure during bonding may preferably be 100 to 20000N.

EXAMPLES

The bonded bodies of the respective examples shown in table 1 were produced, according to the method described referring to FIGS. 1A to 3.

Specifically, it was used a lithium tantalate substrate (LT substrate) having an OF part, a diameter of 4 inches and a thickness of 250 μm as the piezoelectric material substrate 4. It was used a 46° Y-cut X-propagation LT substrate in which the propagation direction of surface acoustic wave (SAW) was made X and the cutting angle was of rotated Y-cut plate, as the LT substrate. The surface 4a of the piezoelectric material substrate 4 was subjected to mirror surface polishing so that the arithmetic average roughness Ra reached 0.3 nm. Further, Ra was measured by an atomic force microscope (AFM) in a visual field of 10 μm and 10 μm.

Further, it was prepared the supporting substrate 1 having an orientation flat (OF) part, a diameter of 4 inches and a thickness of 230 μm and composed of high-resistance (not less than 2 kΩcm) silicon, as the supporting substrate 1. The surfaces 1a and 1b of the supporting substrate 1 were subjected to finishing by chemical mechanical polishing (CMP), so that the respective arithmetic average roughnesses Ra were 0.2 nm.

Then, it was formed the bonding layer 2 composed of $SiO_2$ in 1 μm on the surface of the supporting substrate and the bonding surface 2a was polished by CMP in about 0.1 um for the flattening.

It was then performed ultrasonic cleaning by applying pure water and the bonding surfaces of the piezoelectric material substrate and bonding layer were dried by spin drying. Then, the supporting substrate after the cleaning was introduced into a plasma activation chamber and the bonding surface was activated by nitrogen gas plasma at 30° C. Further, the piezoelectric material substrate was similarly introduced into the plasma activation chamber and the bonding surface of the bonding layer was subjected to surface activation by nitrogen gas plasma at 30° C. The time period of and energy of the surface activation were made 40 seconds and 100 W, respectively. For removing particles attached during the surface activation, the ultrasonic cleaning and spin drying as described above were repeatedly performed again.

Then, the adjustment of positions of the bonding surface of the piezoelectric material substrate and bonding surface of the bonding layer was performed and the activated bonding surfaces were contacted with each other at room temperature. As the centers of the laminated substrates were pressurized, it was observed the state (so-called bonding wave) in which the adhesion of the substrates was spread, confirming that good preliminary bonding was completed. Then, the bonded body was charged into an oven filled with nitrogen atmosphere and heated at 130° C. over 4 hours.

The surface of the piezoelectric material substrate of the bonded body taken out of the oven was subjected to grinding process and polishing process to a thickness of 1 μm.

Here, the bonding layer 2 was film-formed by reactive sputtering method, according to the procedure described referring to FIG. 3. However, the total pressure inside of the inner space of the housing was made 0.1 to 0.2 Pa, the current was made 5 to 10 A, and the voltage was made 500 to 900V. Further, the ratio of the flow rates of argon gas and oxygen gas was changed in a range of 0.90 to 3.50.

The refractive indices at 633 nm of the bonding layers of the respective examples were measured by an ellipsometer and the results were shown in table 1. Further, table 1 shows the magnitude of the second harmonic wave of the thus obtained device (based on the standard that 0.0% is assigned to the magnitude of the second harmonic wave of the comparative example 1).

TABLE 1

| | Ratio of flow Rates (Ar/O2) | Refractive index (633 nm) | Second harmonic Wave (Standardized based on standard that 0.0% is assigned to comparative example 1) |
|---|---|---|---|
| Inventive Example 1 | 1.50 | 1.4740 | −13.5% |
| Inventive Example 2 | 1.67 | 1.4720 | −11.7% |
| Inventive Example 3 | 2.00 | 1.4681 | −10.2% |
| Comparative Example 1 | 2.50 | 1.4648 | 0.0% |
| Comparative Example 2 | 2.90 | 1.4626 | −2.1% |
| Comparative Example 3 | 3.33 | 1.4601 | −2.7% |

As a result, the target discharge voltage was changed, as shown in FIG. 4, in a range of the flow rate of 0.9 to 1.5. That is, it was found that the film-formation mode of the reactive sputtering was changed from metal mode to oxide mode in a flow rate of lower that 1.5.

Further, the refractive index of the bonding layer can be adjusted at 1.468 or higher and 1.474 or lower (particularly preferably 1.472 or higher), by making (flow rate of the inert gas/flow rate of oxygen gas) 1.5 to 2.0 (particularly preferably 1.67 or lower). Further, the film-formation rate of the silicon oxide film was 0.17 to 0.4 (nm/sec). Then, the magnitude of the second harmonic wave could be considerably reduced within such range.

The invention claimed is:

1. A bonded body surface acoustic wave device comprising:

a supporting substrate comprising silicon and having a surface;

a piezoelectric material substrate having an opposing face opposing said surface of said supporting substrate, comprising a material selected from the group consisting of lithium niobate, lithium tantalate and lithium niobate-lithium tantalate and having a thickness of 0.2 to 60 μm; and a bonding layer provided on said surface of said supporting substrate, said bonding layer having a thickness of 0.01 to 10 μm and comprising silicon oxide film, and said bonding layer being present between said surface of said supporting substrate and said opposing face of said piezoelectric material substrate;

wherein said bonding layer has a refractive index of 1.468 or higher and 1.474 or lower.

2. The surface acoustic wave device of claim 1, further comprising an input-side comb electrode of oscillating a surface acoustic wave and an output-side comb electrode receiving said surface acoustic wave, said input-side comb electrode and said output-side comb electrode being provided on said piezoelectric material substrate.

3. A method of producing the surface acoustic wave device of claim 1, said method comprising the steps of:

forming said bonding layer comprising silicon oxide film on said surface of said supporting substrate by reactive ion sputtering method, said reactive ion sputtering method being performed by providing a silicon target and flowing with at least an inert gas and oxygen gas in a ratio of a flow rate of said inert gas with respect to a flow rate of said oxygen gas adjusted at 1.5 to 2.0, wherein said silicon oxide film being formed in a film-forming rate of 0.17 to 0.4 nm/sec; and bonding said bonding layer to said piezoelectric material substrate.

4. The method of claim 3, further comprising the step of providing an input-side comb electrode of oscillating a surface acoustic wave and an output-side comb electrode receiving said surface acoustic wave on said piezoelectric material substrate.

5. The surface acoustic wave device of claim 1, wherein said piezoelectric material substrate and said bonding layer include an activated bonding surface having an arithmetic average roughness Ra of 1 nm or less.

6. The method of claim 3, further including a step of flattening the bonding surface of the piezoelectric material substrate and the bonding surface of the bonding layer before said forming step to form flattened surfaces having an arithmetic average roughness Ra of 1 nm or less.

7. The method of claim 6, wherein the flattening step is by lapping or chemical mechanical polishing.

\* \* \* \* \*